United States Patent [19]

Lantzer

[11] Patent Number: 4,959,119

[45] Date of Patent: Sep. 25, 1990

[54] METHOD FOR FORMING THROUGH HOLES IN A POLYIMIDE SUBSTRATE

[75] Inventor: Thomas D. Lantzer, Fuquay-Varina, N.C.

[73] Assignee: E. I. Du Pont de Nemours and Company, Wilmington, Del.

[21] Appl. No.: 443,301

[22] Filed: Nov. 29, 1989

[51] Int. Cl.$^5$ .................... B44C 1/22; C23F 1/02; C03C 15/00; B29C 37/00
[52] U.S. Cl. ................... 156/644; 156/630; 156/634; 156/652; 156/655; 156/656; 156/659.1; 156/661.1; 156/668; 156/902; 156/643; 156/646; 219/121.69; 219/121.85
[58] Field of Search .............. 156/626, 630, 634, 644, 156/645, 652, 654, 655, 656, 659.1, 661.1, 666, 668, 902; 29/852; 427/53.1, 97; 219/121.68, 121.69, 121.85

[56] References Cited

U.S. PATENT DOCUMENTS

| | | | |
|---|---|---|---|
| 4,426,253 | 1/1984 | Kreuz et al. ................. | 156/644 X |
| 4,472,238 | 9/1984 | Johnson ....................... | 156/644 X |
| 4,635,358 | 1/1987 | Fritz ............................ | 156/644 X |
| 4,642,160 | 2/1987 | Burgess ...................... | 156/668 X |
| 4,714,516 | 12/1987 | Eichelberger et al. ....... | 156/644 X |
| 4,894,115 | 1/1990 | Eichelberger et al. ....... | 156/643 |

*Primary Examiner*—William A. Powell

[57] ABSTRACT

Hole formation in a polyimide substrate employs a carbon dioxide laser.

2 Claims, No Drawings

METHOD FOR FORMING THROUGH HOLES IN A POLYIMIDE SUBSTRATE

FIELD OF THE INVENTION

This invention relates to a method of forming holes in a polyimide substrate useful for electronic components.

BACKGROUND OF THE INVENTION

Current trends in the electronics industry are moving toward higher signal, power, and ground line densities, smaller-size and multiple-layered packages, and increased performance characteristics, such as less crosstalk, lower inductances, and greater resistance to failure from thermal cycling stress. As a result of the increased line densities, the density of interconnections increases and the surface area available for the interconnections, land sites, etc. is at a premium. For example, land areas in the order of 25 mils (0.64 cm) and interconnection hole diameters less than 10 mils (0.0254 cm) are considerably smaller than those in conventional printed circuit board applications. Interconnection holes are also referred to as through holes or vias.

An electronic material structure which is useful in such high density applications is a dielectric substrate composed of a polyimide polymer and a conductor layer, usually copper, on a single or both sides of the substrate. There are many methods by which holes in both the conductor and a dielectric layers can be formed. Typical methods for forming holes can be by punching, mechanical drilling, laser drilling, or photoimaging and etching with either chemical or plasma etching techniques. Not all these methods however are able to adequately form vias with diameters 6 mils (0.015 cm) or less in a polyimide substrate. Chemical etching of a polyimide substrate involves removal of the substrate with an etchant solution which comprises of ethyl or propyl alcohol or mixtures thereof with a basic solution and optionally with a diamine solution. A metal mask or the conductive pattern on the substrate acts as a mask to direct the etch removal of the substrate. There is a disadvantage to chemical etching in that the polyimide substrate may etch to a greater degree in the lateral direction (x-y plane) than in the vertical direction (z plane). This results in the substrate undercutting the conductor layer. Undercut in the formation of small diameter vias is a problem because it increases the size of the pad needed to cover the via. Vias 40 mils or greater in diameter can be accomplished easily with existing mechanical drills. However, mechanical drills less than 15 mils (0.038 cm) in diameter are extremely fragile and subject to breakage which requires time consuming and expensive replacement and repair.

One possible solution to the problem of drilling small diameter vias is the implementation of laser drilling. Several type of lasers, such as excimer and argon ion, are available to drill dielectric materials. The excimer laser is the only known method of laser drilling polyimide substrates to produce clean, small diameter holes in a single step. The excimer laser uses photoablation with electromagnetic energy in the ultraviolet region of the spectra to break the chemical bonds of the substrate and ablate the polyimide. However, an excimer laser is considered a laboratory instrument and as such it is slow and costly and is not readily adapted to an industrial or manufacturing environment. Laser drilling of a polyimide substrate can also be accomplished by use of an argon ion laser. In this method, the area where a hole in the substrate is desired is irradiated with an argon ion laser beam that has bursts of electromagnetic energy at a level sufficient to damage the film but without ablating it. The substrate is then plasma etched so as to remove the polyimide damaged by irradiation. Plasma etching uses a gas, usually oxygen, which attacks and removes the exposed substrate but not the conductor layer. Plasma etching must be closely controlled since it is highly dependent on the temperature of the etchant and gas pressure. The disadvantages to this method are that there is an additional step of plasma etching and that this step typically results in variant diameter holes or deviant hole shape, i.e., undercut.

Further, carbon dioxide lasers have been used to drill holes in epoxy-glass substrates, such as FR4, but not in polyimide substrates. The difficulty with carbon dioxide laser drilling of polyimide substrates is that there is a considerable amount of debris in and about the hole after irradiation. The debris must be cleaned away before any subsequent plating steps as the debris will interfere with electrical interconnections of the component. An additional step of etching by either plasma or chemical etching would need to be done to clean away the debris. As described above, etching by either method is undesirable since the variation in hole diameter or deviation in hole shape directly affects subsequent steps, i.e. plating, bonding, interconnection etc. resulting in poor component performance.

It is therefore an object of this invention to provide a method of forming a small diameter hole in a polyimide substrate by employment of a carbon dioxide laser which results in a hole free of debris and not substantially undercut.

SUMMARY OF THE INVENTION

This invention provides a method of forming at least one through hole with an electrically conductive wall in a polyimide substrate to connect electrically conductive surface portions on opposite sides of the substrate with an initial step of forming at least one hole in the substrate by employment of a carbon dioxide laser for polyimide removal wherein:
(a) the carbon dioxide laser is employed at an average energy density in a range of from 18,000 to 45,000 watts per square inch,
(b) a predominant oxygen containing atmosphere is present,
(c) a carbon dioxide laser beam is defocussed in polyimide removal,
(d) a portion of the carbon dioxide beam passes through the polyimide substrate prior to complete hole formation onto a reflective surface which deflects at least 70% of the beam striking the reflective surface into the polyimide substrate to aid in hole formation, and
(e) relative motion is present between the laser source and the polyimide substrate for at least a portion of the hole formation.

DETAILED DESCRIPTION

The electrical interconnections, between conductor layers in electronic components which are fabricated from a dielectric substrate composed of a polyimide polymer and a conductor layer, usually copper, on single or both sides of the substrate, are generally created by forming holes, in both the conductor and dielectric layers and plating the walls of the holes with a conductive metal, usually copper. These holes can be through holes that, once plated, provide an electrically conductive path from one conductive layer to another, or they can be blind holes that, once plated, provide a landing site for further electrical connection.

Photoimaging and etching are conventionally used to form holes or openings in the conductor layers. Photoimaging and etching on the conductor layers involves photographic printing of usually a positive pattern using a temporary protective coating or resist. The background copper is then etched away by subjecting the substrate to an etching solution, e.g. ferric chloride, ammonium persulfate and the like. The temporary resist is removed from the substrate using appropriate solvents, e.g. alkali soluble resists are removed with alkali solvents. If the holes in a conductor layer are in registration with the holes of the conductor layer on the opposite side of the dielectric, the opening, after the dielectric material is removed, will be a through hole. If the holes of the two conductor layers are not in registration or if holes in the conductor are formed on one side only, the opening, after the dielectric material is removed, forms a blind hole.

The applicant has discovered the process of this invention by which the formation of a hole in a polyimide substrate can be accomplished with a carbon dioxide laser beam. Further, this process lends itself to the formation of very small holes, less than 10 mils preferably 3 to 6 mils, in diameter. In addition to which the holes formed in the substrate are substantially free of the debris that typically results from carbon dioxide laser drilling of polyimide substrates. It will be appreciated that while the present process is particularly advantageous for drilling small holes, the apparatus and process is advantageously applicable for drilling large holes as well. Further, the shape of holes to be opened by this invention is not necessarily circular, as it is possible to form holes of various shapes.

A laser device for producing a laser beam for performing the process of the invention is a carbon dioxide laser which is well known in the art. The carbon dioxide laser device emits a radiation beam having a wavelength of 10.6 micrometer. It is preferable for the laser to operate in a pulsed mode in which input energy is stored within the power supply of the laser. When the energy is stored, as in a capacitor, high levels of energy can be obtained. Discharging this stored energy rapidly into the laser gives rise to high intensity laser pulses. The laser beam is modulated in short pulses in which the pulse length ranges between 0.1 to 0.4 milliseconds and the frequency of the pulses ranges between 800 to 1200 Hertz (pulses per second), most preferably 1000 Hertz. The power of the laser beam is in the range of 15 to 65 watts for effective removal of the polyimide substrate. These ranges are desirable since higher power increases the temperature of the substrate, which can cause burning or delamination of the substrate. Higher frequencies result in shortening the pulse length into a less desirable operating window for the laser.

The laser beam is preferably focused by a focusing mechanism such as a focusing lens. The focal length of the focusing lens should be selected to provide the desired hole diameter. Generally, lenses having focal lengths ranging between 2.5 to 5.0 inches have been found to be suitable. The focal point of the beam may be above or below the substrate surface, thus the beam is defocussed at the drilling site of the hole. Preferably the substrate surface is below the focal point of the beam in a range of 0.110 to 0.215 inches (0.28 to 0.55 cm). It is desirable for the width of the laser beam in this range of distances from the focal point to be larger in diameter than a desired hole diameter of a mask. For example, a 0.020 in. (0.51 cm) beam diameter is used to drill a 0.005 in. (0.013 cm) hole. The diameter of the laser beam being larger than that of the hole in the mask, minimizes any registration problems between the laser beam and the desired hole in the substrate, for more reproducible laser drilling.

A relationship exists between the power of the laser beam and the distance the substrate surface is from the focal point. At either end of the range of possible surface distances from the focal point of the laser beam, the more extreme the other laser parameters must be set in order to form the holes in the substrate. For example, the closer the substrate surface is to the focal point of the laser beam, the lower the required power of the laser beam. At low power, especially in carbon dioxide lasers which have in the order of 325 Watts maximum power, the more difficult it is to maintain a high quality beam profile with respect to average power and pulse length reproducibility. At the other end of the range, the further the distance of the substrate surface is from the focal point, the greater the power requirement of the laser beam. However, this increases the beam diameter and in conjunction a greater amount of oxygen gas, as will be explained below, is introduced into the substrate area. This increased amount of oxygen and power can detrimentally affect, i.e., burn, the exposed conductor layer.

The polyimide substrate when irradiated by the laser beam absorbs approximately 30% and transmits approximately 70% of the power of the laser beam. Thus, not all the energy directed to the substrate where a hole is desired works to vaporize the polyimide substrate. The use of a backing material reflects the transmitted beam back through the remaining dielectric to further assist in vaporization of the polyimide substrate. A reflective backing material, such as an aluminum tooling plate or a conductor layer on the opposite side of the dielectric is suitable for this purpose. It is desirable that at least 70% of the transmitted beam is reflected back into the substrate by the reflective backing material. A preferred backing material is an aluminum such as in a tooling plate which reflects about 98% of the transmitted beam back to the substrate. The backing also aides as a heat sink which lowers the temperature of the surrounding conductive material to prevent damage.

The polyimide substrate for hole formation is placed on an x-y table, so that the defocussed laser beam is located where the via hole is desired and so that the substrate can be moved. Movement of the substrate occurs at two different locations which are during the formation of a via and when the next area for a via opening is located under the laser beam. Movement during the formation of a hole occurs in order to compensate for energy distribution irregularities, i.e. a hot spot in the beam or possible misalignment problems between the substrate and the laser beam. The hot spot is the area of the beam diameter where there is maximum intensity of the laser beam, usually at center of the beam, and as such is more efficient at vaporizing the polyimide substrate. It is preferred that the movement occurs such that the maximum intensity portion of the laser beam irradiates the center of the via hole and rotates in a circular path about the center via hole, approximately midway between the center and the periphery of the via hole. The beam can travel in the circular path one or more rotations. It is understood that relative motion between the substrate and the laser beam can occur by any technique, such as moving the laser beam while the substrate remains in place or by moving the substrate while the laser beam is in place, etc. Preferred is to move the substrate relative to the laser beam. As is understood by one skilled in the art, the motion of the laser beam and/or the motion of the table are controlled with the aid of a programmable controller.

An additional parameter which aids in the formation of very small diameter substantially debris-free holes in a polyimide substrate by a carbon dioxide laser is the use of an assist gas coaxially aligned with the laser beam. The laser beam is configured to pass through an assist gas nozzle which is adjustable in a plane perpendicular to the axis of the laser beam. The assist gas which has been found to aid in polyimide vaporization is oxygen. The assist gas is used during the irradiation of the substrate by the laser beam. A cover atmosphere in the area of the hole formation is created by the gas assist and the use of oxygen supports the vaporization or combustion of the substrate. The oxygen cover gas assists in vaporizing the substrate at a faster rate and helps to vaporize any debris created during the drilling process. The desired range of pressure at which the oxygen gas impinges upon the via is between 15 to 40 psi (1.1 to 2.8 kg/cm$^2$) preferably about 30 psi (2.1 kg/cm$^2$). The distance of the nozzle from the substrate surface can range from 0.050 to 0.150 inches (0.13 cm to 0.38 cm), depending upon the diameter of the nozzle orifice. If the nozzle is much closer, it could interfere with apparatus tooling and disturb the substrate positioning. If the nozzle is much further away, oxygen will cover more than the area being drilled and undesired combustion or oxidation of the substrate can occur. A coaxially aligned gas assist with laser beam drilling is conventional in the art. The gas assist typically blows away the debris produced during the procedure. Unlike the typical purpose of gas assist, in the process of this invention, the gas assist with oxygen aids in the combustion of the polyimide substrate.

The substrate with the previously etched conductor layer is aligned on the table so that the laser beam irradiates those exposed areas of the substrate in which an opening in the conductor layer was formed. Thus the conductor layer which faces the laser beam emitting port during irradiation, acts as a mask for the substrate. Optionally, a separate metal mask, usually copper, e.g., about 35 microns thick can be aligned on top of the conductor layer if desired.

Post treatment of the polyimide substrate, after hole formation by a carbon dioxide laser beam can be done but is not necessary. Generally, a post treatment steps is for cosmetic purposes to remove very small amounts of residue on the surface of the conductor layer. This residue, if left remaining, is not considered to affect the reliability of the conductive holes. A quick, mild etch preferably chemical etch of the holes in the substrate may be desired. Chemical etching of polyimide is taught by Kreuz, U.S. Pat. No. 4,426,253 and is hereby incorporated by reference.

Materials suitable for use in this invention are a single or two-sided conductor layers, usually copper, on an insulating substrate in which the substrate is a polyimide, for example Kapton ® film sold by E. I. du Pont de Nemours, Wilmington, Del. A minimum thickness of the polyimide substrate generally is about 2 to 3 mils. A conductor layer can be formed on the substrate by conventional techniques such as sputtering copper or by laminating copper foil onto the substrate. The necessary thickness of the copper conductor layers is dependent upon the diameter of the hole desired. Generally thicker conductor layers are needed as the hole diameter increases, for example a minimum conductor layer thickness of 4 or 5 microns is sufficient to laser drill a 0.005 in. diameter hole.

Subsequent to hole formation by the process of this invention, electrically conductive paths are made by coating the exposed holes and line patterns with conductor metal, i.e., copper, by such means as electroless deposition.

It is understood that various modifications will be apparent to and can readily be made by one skilled in the art without departing from the scope and spirit of this invention, including all features which would be treated as equivalents thereof by those skilled in the art to which the invention pertains. To further illustrate the present invention the following example is provided.

EXAMPLE

This example explains the method of this invention for through hole formation of 5 mils in diameter (0.013 cm) in a flexible circuit laminate material of a polyimide dielectric substrate layer sandwiched between two conductor layers.

The starting material for this example was a 12×3.5 inch (30.5×8.9 cm) piece of flexible circuit laminate, Etch-a-Flex ®, sold by Southwall Technologies, Palo Alto, Calif. which has 0.002 in. thick dielectric Kapton ® polyimide substrate with a copper conductor layer of about 3000 Angstroms thickness on opposite sides of the substrate. The copper conductor layers were each copper electroplated to be about 8 microns thick. Vias were present in each copper layer and were in registration in the two copper conductor layers. The vias were formed by etching by known photoresist techniques. These vias were 5 mils in diameter.

The laminate was placed on an aluminum tooling plate of the x-y positioning table of a carbon dioxide laser drilling apparatus, Coherent C02 Laser, Model M46, sold by Coherent, Sturbridge, MA. The controller for the laser drill, Model U16 sold by Aerotech, Inc., Pittsburgh, Pa., was programmed to direct drilling of the dielectric substrate in those locations where the vias were etched in the copper conductor layer facing the laser beam emitting port.

Thus the copper conductor layer acted as a mask to aid in the through hole or via formation in the dielectric substrate layer during laser drilling. The following settings for the laser drilling apparatus were used:

Power: 25 Watts
Energy Density: 35,000 watts per square inch
Pulse Length: 0.2 milliseconds
Frequency: 1000 Hertz The distance of the dielectric layer below the focal point of the laser beam was 0.110 inches. A gas jet of oxygen at 30 psi (2.1 kg/cm$^2$) was coaxially aligned with the laser beam with a nozzle distance from the surface of the laminate of 0.075 inches (0.19 cm). To compensate for energy distribution irregularities with the laser apparatus or possible misalignment problems, the dielectric layer of the laminate at each through hole location was drilled by first drilling the center of the through hole, and then drilling continued while rotating the laminate in a 0.002 inch radius circle for 4 rotations. All through holes in the laminate were drilled using an oxygen gas jet and with the laser apparatus continually powered up.

The through holes formed were 5 mils in diameter and visual inspection of the walls of the through holes indicated they were free of debris.

What is claimed is:

1. A method of forming at least one through hole with an electrically conductive wall in a polyimide substrate to connect electrically conductive surface portions on opposite sides of the substrate with an initial step of forming at least one hole in the substrate by employment of a carbon dioxide laser for polyimide removal wherein (a) the carbon dioxide laser is employed at an average energy density in a range of from 18,000 to 45,000 watts per square inch,
(b) a predominant oxygen containing atmosphere is present,
(c) a carbon dioxide laser beam is defocussed in polyimide removal,
(d) a portion of the carbon dioxide beam passes through the polyimide substrate prior to complete hole formation onto a reflective surface which deflects at least 70% of the beam striking the reflective surface into the polyimide substrate to aid in hole formation, and
(e) relative motion is present between the laser source and the polyimide substrate for at least a portion of the hole formation.

2. A method as recited in claim 1 further comprising an additional step of (f) chemical etching the polyimide substrate to remove polyimide residue.

* * * * *